June 22, 1971 R. R. CHAMBERLIN 3,586,541

PHOTOSENSITIVE DEVICES COMPRISING ALUMINUM FOIL

Original Filed April 21, 1966 2 Sheets-Sheet 1

INVENTOR
RHODES R. CHAMBERLIN

BY

HIS ATTORNEYS

INVENTOR
RHODES R. CHAMBERLIN
Louis A. Klein
BY John J. Callahan
HIS ATTORNEYS

United States Patent Office 3,586,541

Patented June 22, 1971

3,586,541
PHOTOSENSITIVE DEVICES COMPRISING ALUMINUM FOIL

Rhodes R. Chamberlin, Dayton, Ohio, assignor to The National Cash Register Company, Dayton, Ohio Original application Apr. 21, 1966, Ser. No. 544,193, now Patent No. 3,449,705, dated June 10, 1969. Divided and this application Aug. 20, 1968, Ser. No. 812,477
Int. Cl. H01v *1/16*
U.S. Cl. 136—206 1 Claim This is a division of application Ser. No. 544,193, filed Apr. 21, 1966.

This invention relates to photosensitive semiconductor devices comprising thin flexible aluminum foil and, more particularly, has reference to photosensitive devices such as photoconductor cells, photovoltaic cells, photoconductor matrices, and the like wherein a thin, flexible, anodized aluminum foil forms the support or substrate for the photosensitive element of the device.

Still more particularly, this invention relates to a novel process for the fabrication of photosensitive devices, comprising means for forming thin flexible photosensitive films on anodized aluminum foil as substrate.

Commercially-available photoconductive devices are basically simple structures which comprise, generally, a highly insulating and inert base or substrate, a photosensitive semiconductor layer or deposit overlaying the substrate, a thin electrode configuration in ohmic contact with the said semiconductor layer, and a package for protection and ease of application. In such prior-art devices, the substrate is generally of glass, quartz, ceramics, and similar heat-resistant materials. The device package or container may be made of different protective materials; however, the package is generally metal or plastic. The common photoconductor package consists of a metallic can with transparent window, such as the TO–5 can. Various plastics are also useful for packaging photoconductors as well as many other types of photosensitive and semiconductive devices.

Photovoltaic devices, in general, are slightly more complex than simple photoconductor cells and comprise, as a minimum, a heat-resistant substrate, a semiconductor junction, at least two electrodes, one of which is transparent, and, usually, a package suited to the intended applications.

In the above-mentioned and related prior-art photosensitive devices, thin semiconducting layers and, in some applications, thin electroconductive layers are applied, singly or as multiple layers, as required, by one or more of several well-known prior-art methods. Conventional methods of applying photosensitive films and/or layers, as by evaporation, chemical deposition, sintering, and vapor reaction, are suitable for certain applications; however, each of these methods is known to suffer from many disadvantages. The principal disadvantages associated with such conventional methods are set forth in U.S. Letters Pat. No. 3,148,084, which issued on Sept. 8, 1964, on the application of James E. Hill and Rhodes R. Chamberlin, and the disclosure of which is incorporated herein by reference. It should be understood that, despite the disadvantages inherent in the above-mentioned methods, for some applications acceptable photosensitive devices may be fabricated therewith; however, for reasons which will be apparent below, the spray process for making thin photosensitive films disclosed in the said U.S. Pat. No. 3,148,084, is greatly preferred.

Of the many advantages associated with the Hill and Chamberlin spray process, among the most important from a practical and manufacturing standpoint are (1) it renders unnecessary the expensive, delicate, difficult-to-control, and sometimes cumbersome equipment of prior-art methods—typically, high-vacuum equipment; (2) it provides a method well adapted for continuous manufacturing techniques: (3) it provides the most efficient and simple method of controlling the film composition, the impurity concentration, and the making of multi-element and/or multi-film combinations; and (4) it provides large photosensitive areas with film uniformity comparable to small photosensitive areas. The above-mentioned features of the Hill and Chamberlin spray process are emphasized herein, not only because that process is far superior to conventional processes for most applications and at least in its relation to the invention, but also because the advantages inherent in the process and in the use of anodized aluminum foil complement each other to a high degree when the process and the foil are used together. For example, anodized aluminum foil may be obtained, in various widths, as a continuous strip in roll form, in which form it is well suited for use in a continuous system for manufacturing many types of photoconductive as well as photovoltaic and the like films and articles. In this regard, it can be seen that the anodized foil in roll form and the Hill and Chamberlin spray process are both highly suited for use in a continuous production system, and, thus, one complements the other.

Among the many other features and advantages which inhere in the use of anodized aluminum foil, per se, the following are specifically pointed out.

(1) Since the foil is flexible and since, in both the batch and continuous manufacturing method, the foil is accordingly held down by vacuum at an even pressure over the heated platen, its use provides for great improvement in uniformity of substrate temperature during spraying. The extreme importance of this feature will be readily appreciated by those skilled in the art. Except with the very small substrate, it is difficult, if not impossible, to obtain uniform surface temperatures with prior-art rigid glass and ceramic substrates. It is known that such lack of temperature uniformity leads to deficiencies in the deposited film. The common deficiencies may become apparent as areas having different degrees of crystallinity, or in some instances the crystal morphology is such, in localized areas, as to render those areas useless for photosensing. Without attempting a theoretical explanation, it has been found that greater uniformity is more readily obtained with the anodized foil of the present invention than with the rigid glass and ceramic substrates of the prior art, and the use thereof obviates such prior-art disadvantages. Generally, such improved uniformity is manifested as improvements in electrical, physical, and optical characteristics of the photosensitive devices in question.

Accordingly, it will be recognized that the fabrication of large-area photosensitive films and devices having uniform characteristics is facilitated by utilizing the novel features of the present invention.

(2) The relatively low cost of anodized aluminum foil per unit area versus the cost of conventional ceramic allows for commercial development and sale of large-area photosensitive films, matrices, and devices. Heretofore, the cost of large-area substrates has been prohibitive and thus effectively discouraged development therein. Especially significant in this area is the fact that the cost of large-area ceramic substrates increases exponentially as the area increases, whereas the foil cost increases only linearly with increase in area.

(3) Compared to devices having conventional substrates, those of the present invention comprising anodized aluminum foil have greatly improved heat-transfer characteristics. Accordingly, when connected with a suitable heat sink, devices of the present invention are effective for operation at power levels far exceeding those attainable with prior-art devices.

(4) The aluminum foil and devices made therewith are very flexible, the characteristic suggesting many novel applications; for example, a foil-based photocell may be wrapped or folded around a light source to more efficiently sense radiated light. Thus, foil-based photo elements make it possible to compact many elements into a small photo-module package. Additionally, the flexible character of the foil allows the use of continuous manufacturing techniques for the fabrication thereof.

(5) In the many applications where weight and/or size are critical, foil-based devices are clearly of great advantage. It has been found that solar or photovoltaic cells comprising anodized aluminum foil, according to the instant invention, provide a substantial increase in power-to-weight ratio when compared with prior-art cells of comparable area. Specifically, the power-to-weight ratio of the solar or photovoltaic cells of the invention is at least double that of prior-art cells of the same size. The great saving in weight is due primarily to the difference in foil weight. That is, a typical non-aluminum base foil consists of 1-mil-thick phosphor-bronze foil with thin layers of CdS and $Cu_xS_y$ thereon. A three-inch by three-inch foil of this composition weighs about 1.6 grams; however, the same size aluminum foil weighs only about 0.58 gram.

(6) Photosensitive layers, as small individual cells or as a complex matrix, may be formed in any desired configuration and cut or punched out of the foil directly, as in a continuous manufacturing system. The apparent ease with which anodized aluminum foil structures may be formed is, among others, an important characteristic rendering such material so well suited for use in an automated continuous belt or line process. The foil characteristics are such as to allow for production of photosensitive devices on a continuous basis. In carrying out a manufacture of this type, consecutive stations, such as thin-film spraying, heat-treating, electroding, punching out, etc., are arranged along the foil, which is moved at a carefully programmed rate.

(7) Foil-based photosensitive devices may be packaged, encapsulated, or laminated in any manner and with materials known in the art. Additionally, however, a unique polymeric package is possible with devices which comprise an anodized aluminum substrate. Inasmuch as the aluminum foil is impervious to moisture, it is possible to seal a photo-element on a foil base by heat-bonding a plastic film to the upper, or light-sensitive, surface of the foil.

In some applications, particularly in relation to photoconductive and photovoltaic devices, use of flexible aluminum foil provides substantial reduction in manufacturing time. Its use in photovoltaic cells, for example, eliminates at least two electroplating steps, such being usually required in making an alloy interface on a phosphor-bronze foil. Furthermore, the economy provided by eliminating the two electroplating steps is reinforced by the substitution of sprayed layers or films, in accordance with the Hill and Chamberlin United States patent, for all active and necessary elements of the cells.

Accordingly, it is the principal object of the present invention to provide novel photosensitive devices which comprise, as substrate, a flexible anodized aluminum foil and, as a photosensitive element, at least one semiconductive thin film adherently combined therewith.

Another object of the invention is the provision of a fast, efficient, and economical method for manufacturing high-quality photosensitive devices, wherein a continuous length of anodized aluminum foil is controllably fed through processing stations on a continuous basis, resulting in finished and packaged devices at a selected terminal station of the continuous processing line.

Yet another object of the invention is the provision of a photoconductive device comprising anodized aluminum foil as a substrate effective in high power level operation. Devices of the invention have superior heat-transfer characteristics, and, when used with a heat sink, they at least double the power-to-area ratio which is common with conventional glass or ceramic devices.

Still another object of the invention is to provide a photosensitive film comprising anodized aluminum foil wherein the film has superior physical as well as electrical uniformity.

A further object of the invention is the provision of large-area photosensitive devices comprising a thin photosensitive layer deposited on anodized aluminum foil.

Another object of the invention is to provide a photosensitive device comprising a photosensitive layer disposed on anodized aluminum foil wherein the combination is wrapped or otherwise bent into a regular or irregular shape, so as to expose selected areas to light or to facilitate the fabrication of devices having irregular or complex contours.

Yet another object is to provide a complex photosensitive array or matrix disposed on flexible anodized aluminum foil, which, because of inherent advantages realized by use of foil, permits the economical manufacture of such complex structures.

Still another object of the invention is to provide a photosensitive device comprising a plurality of thin films on a substrate of anodized aluminum foil wherein the said thin films are deposited on said foil by a spray process and where at least one of said films is photosensitive.

The novel features of the invention, together with further objects and advantages thereof, will be more clearly understood from the following descriptions, considered in connection with the accompanying drawings, in which several embodiments of the invention are illustrative.

Figure 7A:
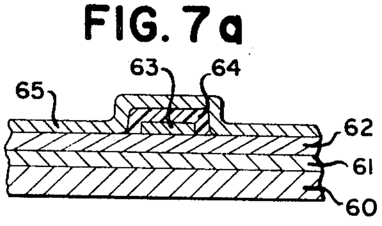
FIG. 7 is a plan view of a photosensitive switching matrix wherein the substrate is a flexible foil in accordance with the invention.
Figure 7:
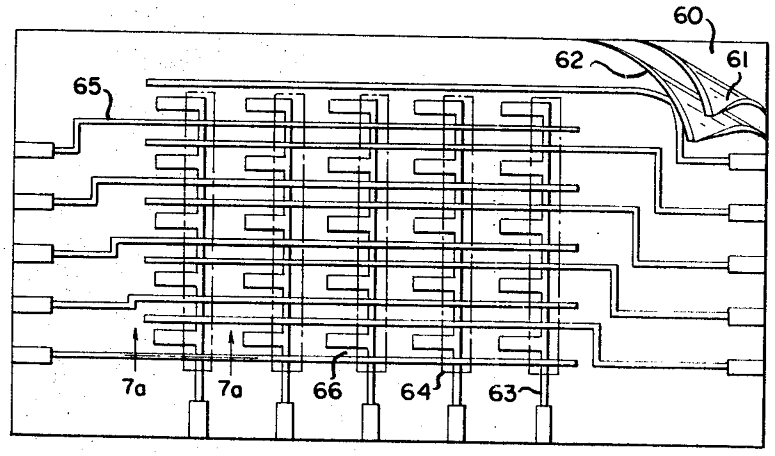

FIG. *7a* is a cross-sectional view of the matrix of FIG. 7 taken along line *7a—7a*.

Figure 1:
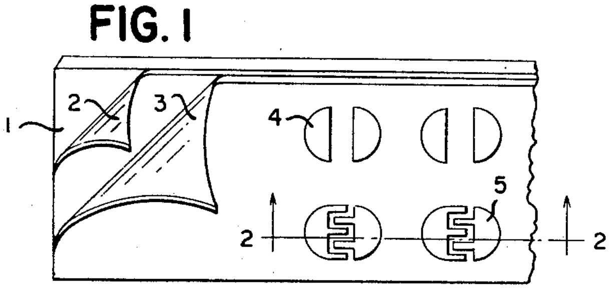
FIG. 1 is a top view of an aluminum foil segment diagrammatically illustrating two types of photocell configurations and a hypothetical situation wherein the separate films are rolled back at a corner.

Referring now to FIG. 1, there is shown a section of aluminum foil 1 having films or layers 2 and 3, shown folded at one corner, and photoconductor cell electrodes of configuration 4 and 5 disposed on the surface thereof. The layer 2 is a very thin highly insulating layer of $Al_2O_3$ which is formed on the aluminum surface by well-known prior-art anodizing processes. From a practical standpoint, however, it is generally advantageous to avoid the anodizing step and, instead, to utilize commercially available anodized aluminum foil as substrate material. The foil may be obtained in sheet or roll form having a thickness of 1 to 10 mils. Generally, the anodized film ranges from 0.05 mil to 0.5 mil in thickness, and the total thickness of the foil plus the anodized film is about 1.7 mils. The layer 3 of FIG. 1 is a thin photoconductive film selected from the usual photoconductive compositions. The most common photoconductive compounds are Class II–VI compounds; more specifically, such compounds are generally sulfides and selenides of zinc, mercury, and cadmium, or compounds comprising mixtures of these elements. Although many methods are known for depositing photosensitive films, such as vacuum-evaporated, silk-screened, or painted films, the preferred method for the purpose of this invention is that disclosed, as mentioned above, in U.S. Pat. No. 3,148,084. There is disclosed therein a method of forming thin films by spraying a solution of the film-forming elements comprising (a) uniformly heating the substrate to an optimum temperature, usually above 200 degrees Fahrenheit, (b) spraying thereon a solution of the film-forming elements, and (c) post-heat-treating the so-deposited film at between 900 degrees Fahrenheit and 1,200 degrees Fahrenheit in a controlled atmosphere. It is clear from the said U.S. Pat. No. 3,148,084 that the desired substrate temperature is, at least, a function of the composition of the P.C. (photoconductive) film and of the heat transfer characteristics of the substrate. The optimum substrate temperature for spraying of high heat transfer substrate materials, such as alumina, is substantially less than that with a glass substrate. Accordingly, the temperature of anodized aluminum foil, during the spray operation, is generally lower than those disclosed in the above-mentioned United States patent, the optimum temperature of such foil being readily ascertainable by the skilled artisan. The preferred substrate temperature, however, ranges from 400 to 450 degrees Fahrenheit, and the post-heat-treating temperature ranges from about 1,000 degrees Fahrenheit to 1,100 degrees Fahrenheit.

Post-heat-treatment of photoconductor films at temperatures around 1,100 degrees Fahrenheit is one of several conventional methods for improving photoconductive characteristics such as the light-to-dark ratio, etc., in such films. An extension of the simple heat treatment, above, combines what is conventionally known as "activation" with the heat treatment. The latter consists of firing, at elevated temperatures, a photosensitive film which has been covered with a "covering powder" which comprises suitably doped host crystals. The doping consists of suitable amounts of doping elements such as copper and/or chlorine. Although such prior-art heat treating and activation methods may be used with the films of the present invention, a preferred method, combining heat treating and activation, is disclosed in the United States patent application of Rhodes R. Chamberlin and John S. Skarman, Ser. No. 386,606, filed July 31, 1964, and commonly assigned with the present application. The invention described therein relates to an improved process for activating photosensitive films and the like, and it is intent to incorporate the said application disclosure herein.

Two electrode configurations are shown in FIG. 1, the metal tab configuration of the electrode 4 and the interdigital type of the electrode 5. The electrodes are applied to the surface of the photoconductive layer 3 by vacuum evaporation, silk screening, or painting. Preferably, they are applied by vacuum evaporating indium metal by known techniques through openings in a suitable mask.

In the strip shown in FIG. 1, the areas shown by the electrode configurations 4 and 5 are cut or punched out of the foil strip, leads are attached to the electrodes by soldering or other conventional means, and the whole is placed in a suitable package, such as a metal can with window, transparent plastic, glass, and the like to provide individual photosensitive elements.

Figure 2:
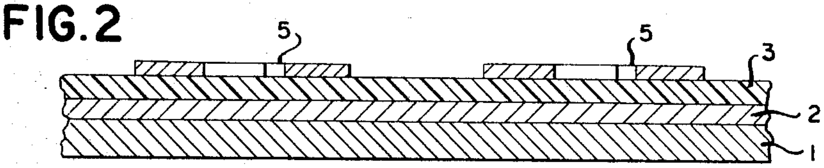
FIG. 2 is a cross-sectional view of the foil shown in FIG. 1, the section taken on line 2—2.

Referring now to FIG. 2, there is shown a cross-sectional view of the aluminum foil of FIG. 1 taken along the line 2—2. It can be seen that the anodized film 2 and the photoconductive film 3 are arranged in superposed relation on the aluminum foil substrate 1. The electrodes 5 are adherently disposed on the layer 3, the electrode configuration being so selected as to provide a desired area and concomitant conductivity range.

Figures 3, 4:
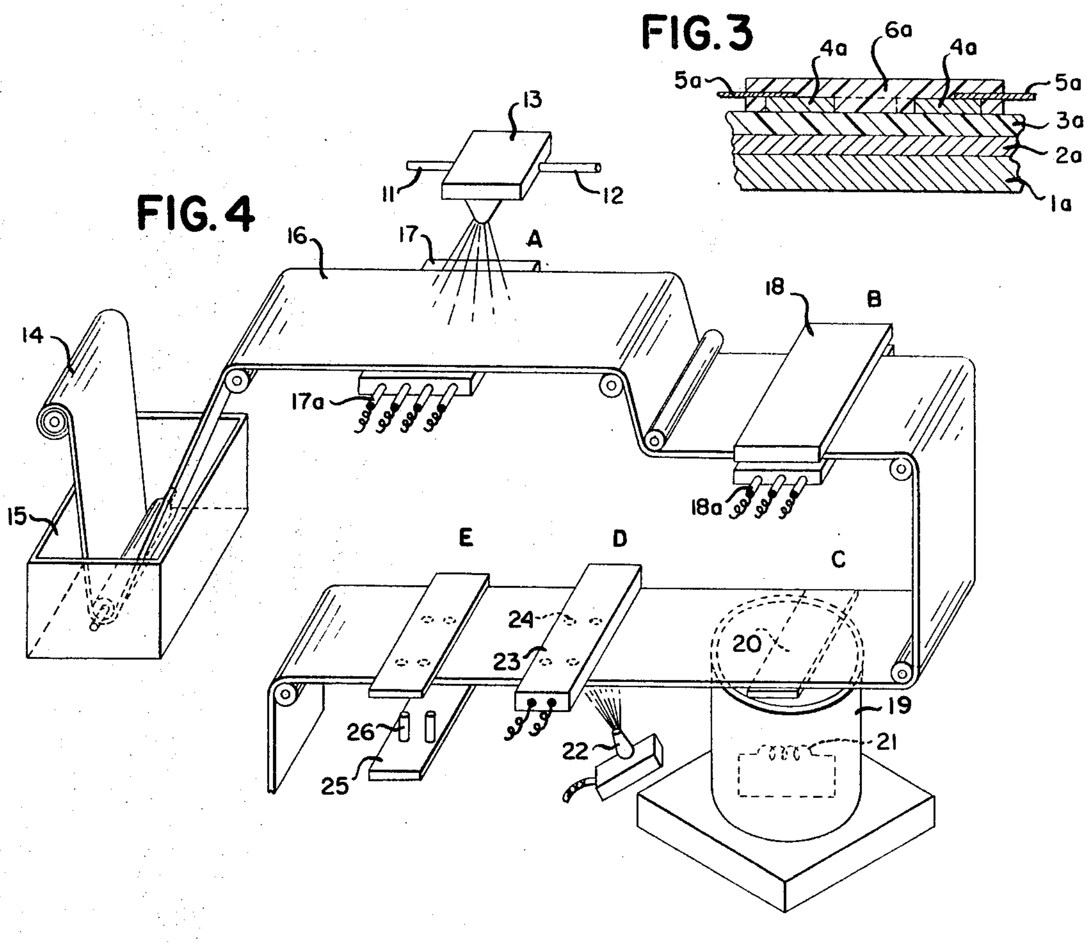
FIG. 3 is a cross-section of an embodiment which includes a discrete photoconductive element.
FIG. 4 is an isometric view of a continuous manufacturing line wherein foil is fed at one end and finished items are obtained at the other end.

Referring to FIG. 3, there is shown, in cross-section, a photosensitive element packaged in a plastic protective covering. The photoelement of FIG. 3 is typical of the type of discrete components which are easily and efficiently made by the automated continuous line process of the invention, as exemplified in FIG. 4. The photosensitive component of FIG. 3 includes anodized film **2*a* adherently disposed on the aluminum foil substrate 1*a*. The film 3*a* is a semiconductive film adherently coated on the said film 2*a*. The leads 5*a* are bonded to the electrodes 4*a*, the electrodes forming an ohmic contact with the photoconductive surface of the film 3*a*. The said leads are, preferably, flat tinned copper leads, which may be bonded (soldered, welded, or cemented) to the electrodes 4*a*. One particularly valuable method consists of ultrasonically soldering the parts with indium; in another method, conductive epoxy adhesive is the bonding agent. The outermost surface or film 6*a* consists of a protective polymeric film. Suitable polymeric materials include transparent insulating thermosetting and thermoplastic polymers. Materials having the desired characteristics will be apparent to those skilled in polymer art, and, consequently, only a few exemplary polymers will be named herein. Among many suitable materials, transparent epoxy resins, polystyrene, polyvinyl, polyacrylic, and polystyrene copolymer materials are preferred. It should be understood that copolymers, as well as homopolymers, of the above-named polymer types are within the purview of the invention. The film 6*a* may be formed by conventional processes, such as drying a solution of the polymer, spraying a polymer dispersion thereof followed by thermal fusion, and heat-bonding or laminating a thin polymer film onto the surface of the photoconducting film 3*a***. Other means include rolling and dip-coating methods with plastisols and organosols of vinyl resins, for example.

One embodiment, exemplified by the element shown in FIG. 3, consists of (1) a photoconductive layer of CdS formed on an anodized aluminum foil, the foil being three inches square and having a five-mil-thick aluminum substrate overlaid with a 0.3-mil-thick alumina ($Al_2O_3$) layer. The photoconductive layer of CdS is formed on the above-described foil by spraying a solution .01 molar in $CdCl_2 \cdot 2\frac{1}{2}H_2O$ and .01 molar in thiourea onto the surface of the said foil, which is maintained at about 430 degrees Fahrenheit during the spray operation. The spray rate is maintained at between five and ten milliliters per minute. Except as modified by any of the specific parameters mentioned herein, the spray process of Hill and Chamberlin is preferred for making the instant photoconductive film. The three-inch-square foil is then placed in an oven for post-heat-treating and activating the photoconductor film. This treatment is conducted as generally disclosed in United States patent application of Rhodes R. Chamberlin and John S. Skarman, Ser. No. 386,606, filed July 31, 1964; more specifically, the specimen is heated for fifteen to twenty minutes at about 1,050 degrees Fahrenheit in an activating atmosphere which is supplied from a coating containing Cu and Cl atoms. The coating is disposed on the inside of a ceramic boat or the like, which is placed over the film to be activated during the heat treatment; (2) electrodes of desired configuration and size (typically, the electrodes 4 and 5 of FIG. 1) are now deposited on the activated film. A mask containing the electrode configuration is registered on the light-sensitive side of the foil, the pair in registry is placed in a vacuum chamber, and, after evacuation of the chamber to at least $10^{-4}$ torr, indium metal is evaporated through the mask apertures onto the light-sensitive layer being masked; (3) wire leads are connected to the said electrodes, as exemplified by the leads 5*a* in FIG. 3. Tinned copper leads are bonded to the electrodes with silver containing epoxy resin; and (4) a plastic covering, like the film 6*a* of FIG. 3, is formed on the photosensitive side of the element by heat and/or pressure bonding transparent epoxy resin to its surface.

Referring now to FIG. 4, there is shown, in perspective, an automated and continuous line arrangement for economically producing light-sensitive articles and devices of the type above described; that is, wherein light-sensitive materials are disposed on anodized aluminum substrate.

FIG. 4 represents a preferred arrangement of treating or processing stations particularly adapted for fabricating photoconductive elements. Specifically, the processing stations of FIG. 4 are placed in an order suitable for the fabrication, for example, of photoconductive cells illustrated in FIGS. 1 and 3. In general, a continuous manufacturing line of the type mentioned comprises, in order, processing stations A through E, as shown in FIG. 4. As mentioned above, means are provided for moving the aluminum foil from the storage roll 14 at a carefully programmed rate which permits a given foil area to remain at a processing station for the required time. Either anodized or untreated aluminum foil in roll form is available on the market. When untreated aluminum foil is utilized as the substrate material, a .05-mil to .5-mil thick $Al_2O_3$ insulating film is developed on a surface of the foil in the anodizing station 15. Conventional anodizing techniques are adequate. The anodizing step is, of course, obviated with the use of commercially anodized aluminum foil.

Station A (FIG. 4) comprises apparatus suitable for spraying a semiconductive film 16 on a heated portion of the anodized foil. The film 16 is formed by spraying a semiconductor-film-forming solution through a spray head 13. The solution enters the spray head by means of the tube 12 and is agitated and pressurized by air obtained from the tube 11. The foil area being sprayed is maintained at a predetermined temperature by contact with a smooth platen 17, which is heated by rod heaters 17*a*. As described hereinabove, during the spray operation the foil is advantageously held down evenly over the platen 17 by a vacuum applied thereto through small holes (not shown in FIG. 4) dispersed in the said platen block 17. Details regarding materials, temperatures, and other parameters connected with the spray operation at station A are plain from the foregoing and in view of U.S. Pat. No. 3,148,084, which is incorporated herein by reference.

In the cooperative arrangement shown in FIG. 4, station B is a heat-treating station which comprises a heating block 18 having rod heaters 18*a*, which in this embodiment are preferably electrical rod heaters. Other suitable heating means may, of course, be utilized. As mentioned above, post-heat-treating temperatures ranging from 1,000 degrees Fahrenheit to 1,100 degrees Fahrenheit are usually adequate. In some instances, the preferred heat-treating and activating process described in United States patent application Ser. No. 386,606, filed July 31, 1964, by Rhodes R. Chamberlin and John S. Skarman, may, with advantage, be incorporated into the operation of station B. Optimum heat-treating parameters under this process have generally consisted of heating the piece or pieces for about fifteen minutes at 1,050 degrees Fahrenheit.

Whether or not heat-treatment at station B is performed, a selected coated foil area is placed in proper registry with an intended electrode mask at vacuum electroding station C, where a selected metal electrode pattern is deposited thereon. Essentially, station C includes a vacuum chamber 19 and bell jar or other adequate sealing means (not shown) suitable for metal evaporation, mask holding and positioning means 20, and metal evaporating means 21. These and other features of station C are well known in the metal evaporation art and hence will not be described herein.

When indicated by the type, configuration, etc., of the photoconductive element being fabricated, other processing stations are added or subtracted, as required, to or from the continuous line manufacturing arrangement. For example, station D (FIG. 4) exemplifies one mode of applying a polymeric protective coating to the surface of any materials associated with the anodized aluminum foil. Station D is thus seen to consist of a spray head 22, which directs a polymer solution comprising an evaporable solvent onto the foil surface area positioned directly adjacent the rod heater 23. Thus, in the continuous process, the rod heater 23 is heated to a temperature adequate for evaporating the solvent of the said polymer solution so as to deposit a protective polymeric film on the respective solution-sprayed semiconductive elements 24 included within the sprayed foil area. Other packaging and/or coating means will be apparent to skilled artisans.

Station E represents punching or cutting means designed to isolate polymer-coated photosensitive areas, such as the areas 24 provided by prior processing, from the thin strip of aluminum foil. The processed photosensitive areas are delineated and punched out of the foil by conventional punch-press and related means, illustrated at station E by the die 25 and the metal block 26, the foil being pressed between the said die and the metal block at sufficient pressure to produce a cutting action on the foil.

Figure 5:
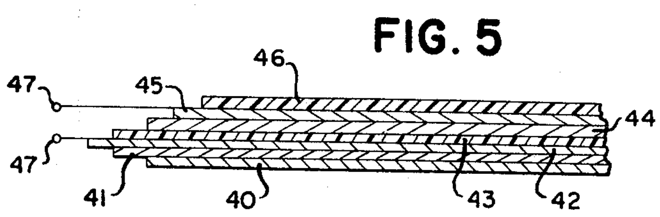
FIG. 5 is a cross-sectional view of a typical photovoltaic embodiment according to the invention.

FIG. 5 illustrates, in enlarged cross-section, active and inactive layers comprised in a preferred photovoltaic or solar cell embodiment according to the invention. The structure of FIG. 5 comprises a plurality of layers stratified over the aluminum substrate layer 40. The structure includes layers 41 and 42 superimposed, in that order, over the layer 40, the layer 41 defining an insulating thin film of $Al_2O_3$ in contact with the layer 40, and the layer 42 defining a conductive thin film of tin oxide ($SnO_x$) adherently deposited on the surface of the said layer 41. Junction layers 43 and 44 are adherently overlaid, in that order, over the tin oxide conducting layer 42. In a preferred embodiment, the layer 43 consists of an ultrathin film of CdS, preferably about one micron thick, and the layer 44 consists of an even thinner junction film, preferably about 0.1 micron thick, of $Cu_xS_y$ (digenite) evenly distributed over the surface of the layer 43. The layer 45 represents, in sectional view, the current collector structure of the solar cell embodiment. The collector layer 45 is generally in the form of a grid pattern consisting of fine lines of a conducting metal such as tin, silver, copper, and gold. The preferred grid pattern consists of gold. It has been found, for example, that tin current collectors tend to short-circuit the cell at high temperature around 200 degrees centigrade. At the same temperature, gold collectors still provide adequate performance. The thinner the lines and the fewer the lines per inch, the greater the area utilization. The optimum number of lines is dependent on the surface conductivity of the junction layer. Metallic grid patterns of the type above described are deposited by well-known techniques such as vapor deposition, silk screening, electrodeposition, and the like.

The plastic layer 46 illustrates an optional feature of the invention, which may also be used with advantage with many embodiments disclosed herein. According to the preferred practice of the invention, it is desirable to cover the surface of the layer 44 and the metallic grid lines 45 with a transparent organic lacquer or polymeric coating 46. The coating not only serves to protect the layer 44 from abrasion, scratches, moisture, etc., but additionally provides dimensional stability to delicate surface cell elements represented by the metallic grid layer 45 and the leads 47. The latter are connected to the upper and lower cell electrodes 45 and 42 by well-known procedures such as those set forth in the description of the embodiment of FIG. 3 above. Polymer compositions and processes suitable for making the transparent polymer layer 46 are the same as or similar to those previously disclosed in connection with FIG. 3 above.

The conducting tin oxide ($SnO_x$) layer 42 and the semiconducting layers 43 and 44, CdS layer and $Cu_xS_y$ layer, respectively, may be fabricated, with varying degrees of success, by one or another of many processes conventional in the conductive layer art. However, it is a unique feature of the instant invention and a preferred mode of operation to prepare each of the respective layers mentioned above by a spray process. The CdS and $Cu_xS_y$ layers are prepared as described in the above-cited U.S. Pat. No. 3,148,084, whereas the tin oxide ($SnO_x$) layer 42 is made in accordance with well-known spray techniques for making electroconducting films. Preferably, the layer 42 is made by spraying onto anodized aluminum layer 41 a solution which is 14.3 molar in $SnCl_4$. For optimum results, the anodized foil, which consists of the aluminum substrate 40 and the superposed layer 41 of aluminum oxide, is maintained at about 500 degrees centigrade during the tin oxide spraying operation.

The semiconductive layer 43 is formed to a thickness of about one micron by spraying onto the layer 42, at a temperature of about 325 degrees centigrade, a solution which is .01 molar in $CdCl_2$ and .01 molar in thiourea. Again, the same general spray process of U.S. Pat. No. 3,148,084 is used for making the sprayed $Cu_xS_y$ layer. In this procedure, a 0.1-micron-thick layer of $Cu_xS_y$ is formed on the CdS layer 43, which is maintained at 125 degrees centigrade, during this operation, by spraying thereon a solution .0025 molar in both copper acetate and n,n dimethyl thiourea. After deposition of the $Cu_xS_y$ layer, photoconductive cells of this embodiment are generally heat-treated between 210 and 260 degrees centigrade for a period of one to two minutes, preferably one (1) minute at 250 degrees centigrade.

Figure 6:
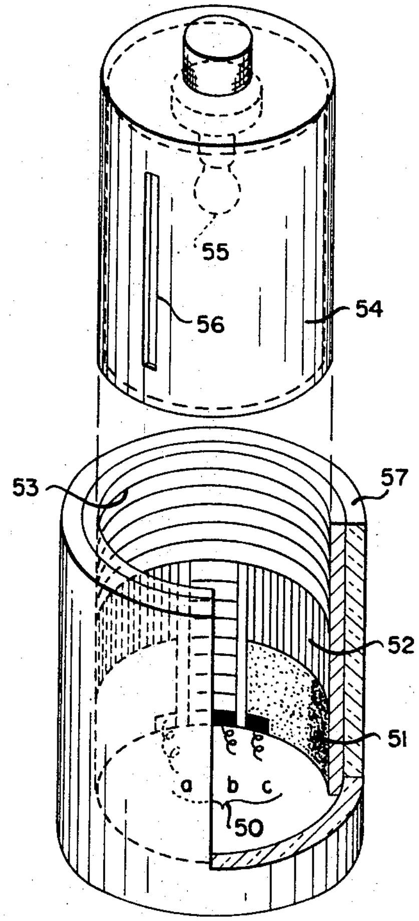
FIG. 6 is an expanded view of a potentiometric device comprising a folded aluminum foil in accordance with the invention.

Referring to FIG. 6, there is shown an embodiment, by way of example only, wherein the flexible character of the anodized aluminum foil is particularly valuable. The embodiment of FIG. 6, shown in exploded view, is exemplary of a photosensitive structure comprising flexible aluminum foil, and specifically depicts a contactless potentiometer, so-called.

In FIG. 6, a device having an outer body assembly 57 and an inner body assembly 54 is shown with the latter in a position removed from its normal operative position within the outer body assembly 57. The inner body assembly 54 acts as a light shield and comprises a cylindrical opaque body with means provided therein, such as the light means 55, for illuminating the light slit 56. In accordance with the invention, the outer body assembly 57 is provided with a photoresistive assembly, contiguous with the inside surface of said body 57, which comprises thin conductive areas 51, 52, and 53. In accordance with the invention, the conductive areas 51, 52, and 53 are advantageously disposed, typically in the shape shown in FIG. 6, on a strip of flexible anodized aluminum foil, which, as depicted, is then folded to fit tightly inside the outer body assembly 57. The photoresistive assembly comprising the areas 51, 52, and 53 is so positioned that light transmitted by the light slit 56 impinges on the photoresponsive area 52. In a representative voltage divider or contactless potentiometer of the type shown in FIG. 6, the sheet resistances of the said areas are different in magnitude. The area 53 is a predominantly conductive area having a terminus for electrical contact shown as lead *b* of contact points 50. The conductive area 53 may, for example, consist of indium, which may be applied by evaporation of the metal, or by dipping an area of aluminum foil in molten indium, etc. Indium conductive areas of the type described have low resistance; for example, approximately .01 ohm per square. In contrast to the low-resistance area 53, the area 51 is a relatively high-resistance film disposed along one edge of an anodized aluminum foil, as shown. Leads *a* and *c* are connected one to each extremity of the resistive area 51. The area 51 may typically consist of a dried strip of resistive paint or silk-screened cermet metal composition and the like, the materials and the techniques being conventional. Representative resistances of the area 51 film may be, for example, 1,000 ohms to 1 megohm.

The semiconductive area 52 is in contact with both the conductive area 53 and the resistive area 51. In this position, the area 52 serves as the means for carrying current between the areas 53 and 51. When the inner assembly 54 rotated on its vertical axis, the light slit 56 is moved 360 degrees, if desired, and thus moves from one extremity of the resistive path 51 to the other. In effect, movement of the light slit 56, as described, provides a conducting path in the semiconductor area 52, which may be adjusted from one end to the other of the primarily resistive strip 51. Not shown in FIG. 6 are means for turning the inner body assembly 54, electrical measuring means, and the like, which may be provided in conventional or suitable form.

Of particular significance to the present embodiment of FIG. 6 is the use of thin flexible anodized aluminum foil as substrate for a photoconductive film which may be bent into a desirable shape, with great utility and with no difficulty whatsoever.

The photoconductive area 52 may be prepared by conventional procedures with known light-sensitive materials such as CdS, ZnS, CdSe, etc. However, in view of the foregoing, it will be understood that spray-deposited CdS, CdSe, etc., films, with or without post-heat-treatment in this particular application, as referred to in U.S. Pat. No. 3,148,084, are the preferred photoconductive materials of the area 52.

Referring now to FIG. 7, there is shown a top view of a section of a photoconductor matrix. In accordance with the invention, a plurality of photosensitive areas 66 are defined at the intersection of horizontal and vertical conductive electrode patterns, 65 and 63, respectively, as apparent in FIG. 7. The photosensitive areas 66 may be disposed in any desirable pattern or array and need not be restricted to the pattern of FIG. 7. Preferably, the areas 66 are photoconductive functional areas, outlined as above described, forming a portion of a thin photoconductive film 62 superposed over a thin foil of anodized aluminum. In FIG. 7, the anodized aluminum is shown as aluminum foil substrate 60 superposed with an aluminum oxide layer 61. The same relation is apparent in the enlarged cross-sectional view 7*a* taken along the indicated line in FIG. 7. Since the horizontal electrodes 65 and the vertical electrodes 63 intersect, and since the only conducting path between any two intersecting electrodes is intended to be photoconductive areas typified by the area 66, the requirement for a highly insulating dielectric interposed between overlapping electrode segments is apparent from both FIGS. 7 and 7*a*. In FIG. 7, insulating material 64 is shown as a narrow vertical strip completely covering the vertical electrodes 63. Enlarged FIG. 7*a* shows, in cross-section, a vertical electrode 63 insulated from contact with the electrode 65 by the stated insulating layer 64. Known insulating materials are suitable for making insulating layer 64. A typical plastic insulating material may be, for example, one of many available polyvinyl formal resins sold under the trademark "Formvar." Other insulating materials, such as $SiO_2$, glass, and the like may also be used for the layer 64. It should be understood that the photoconductive layer 62 and the electrodes 63 and 65 of FIGS. 7 and 7*a* may be prepared as hereinabove described and particularly by the preferred description set forth above.

What is claimed is:

1. A thin film photovoltaic cell with up to at least 4% solar energy conversion efficiency, comprising (a) a flexible anodized aluminum foil, and (b) a plurality of flexible thin films adherently superposed thereon, (c) at least two of said films forming a photovoltaic barrier junction, at least a portion of each of the said two films having an electrode in ohmic contact therewith, one of the said barrier junction films consisting essentially of CdS of not more than 1.5-micron thickness, the other of said barrier junction films consisting essential of $Cu_xS_y$ of not more than 0.2-micron thickness.

References Cited

UNITED STATES PATENTS

| | | | |
|---|---|---|---|
| 3,148,084 | 9/1964 | Hill et al. | 136—89UX |
| 3,419,434 | 12/1968 | Colehower | 136—89 |

BENJAMIN R. PADGETT, Primary Examiner

H. E. BEHREND, Assistant Examiner

U.S. Cl. X.R.

136—89